(12) United States Patent
Kaminishi et al.

(10) Patent No.: US 9,681,569 B2
(45) Date of Patent: Jun. 13, 2017

(54) ELECTRICAL CONNECTION BOX

(71) Applicants: FURUKAWA ELECTRIC CO., LTD., Tokyo (JP); FURUKAWA AUTOMOTIVE SYSTEMS INC., Shiga (JP)

(72) Inventors: Toshimichi Kaminishi, Shiga (JP); Shinichi Jingama, Shiga (JP); Fumikazu Naimi, Shiga (JP)

(73) Assignees: FURUKAWA ELECTRIC CO., LTD., Tokyo (JP); FURUKAWA AUTOMOTIVES SYSTEMS INC., Shiga (JP)

( * ) Notice: Subject to any disclaimer, the term of this patent is extended or adjusted under 35 U.S.C. 154(b) by 0 days.

(21) Appl. No.: 14/786,960

(22) PCT Filed: Mar. 12, 2014

(86) PCT No.: PCT/JP2014/001403
§ 371 (c)(1),
(2) Date: Oct. 23, 2015

(87) PCT Pub. No.: WO2014/174753
PCT Pub. Date: Oct. 30, 2014

(65) Prior Publication Data
US 2016/0073534 A1 Mar. 10, 2016

(30) Foreign Application Priority Data

Apr. 26, 2013 (JP) ................. 2013-094684

(51) Int. Cl.
H05K 7/02 (2006.01)
B60R 16/023 (2006.01)

(52) U.S. Cl.
CPC .......... *H05K 7/026* (2013.01); *B60R 16/0238* (2013.01)

(58) Field of Classification Search
CPC . H05K 2201/09754; H05K 2201/0999; H05K 7/026; H05K 5/0026; H05K 5/06;
(Continued)

(56) References Cited

U.S. PATENT DOCUMENTS

| | | | |
|---|---|---|---|
| 6,244,877 B1 * | 6/2001 | Asao | ............. H01R 9/2466 361/760 |
| 7,156,677 B2 * | 1/2007 | Yamane | ............ H01H 85/2045 439/206 |

(Continued)

FOREIGN PATENT DOCUMENTS

| | | |
|---|---|---|
| JP | 2002152943 A | 5/2002 |
| JP | 2006067641 A | 3/2006 |

(Continued)

OTHER PUBLICATIONS

International Search Report mailed Apr. 8, 2014 for PCT Application No. PCT/JP2014/001403, 2 pages.

*Primary Examiner* — Courtney Smith
*Assistant Examiner* — Sagar Shrestha
(74) *Attorney, Agent, or Firm* — Amin, Turocy & Watson, LLP

(57) ABSTRACT

Provided is an electrical connection box that achieves downsizing by means of efficient arrangement of electronic components and terminals on a board. An electrical connection box (1) includes a board (21), a terminal holder (22), flat-plate terminals (23), and electronic components (24). The terminal holder (22) is mounted to the board (21). The flat-plate terminal (23) includes a first portion (41), a second portion (42), and a third portion (43). The first portion (41) is connected to the board (21), and extends substantially perpendicularly from the board (21). The second portion (42) is connected to the first portion (41), and extends substantially in parallel with the board (21). The third portion (43) is connected to the second portion (42), is (Continued)

connectable to a connector, and extends substantially perpendicularly to the board (21). The electronic component (24) is arranged between the second portion (42) of the flat-plate terminal (23) and the board (21).

2 Claims, 7 Drawing Sheets

(58) Field of Classification Search
CPC ...... H05K 5/0095; H05K 5/0069; H05K 5/02; H05K 5/0004; B60R 16/0238; Y10S 439/949
USPC .......... 361/679.01, 728, 752, 760, 774, 800; 439/76.2, 949; 174/50, 520, 527, 535, 174/559, 560
See application file for complete search history.

(56) References Cited

U.S. PATENT DOCUMENTS

| | | | | |
|---|---|---|---|---|
| 7,532,458 B2 * | 5/2009 | Sasaki | ................ | B60R 16/0239 307/10.1 |
| 2004/0214458 A1 * | 10/2004 | Maebashi | ................ | H01H 9/10 439/76.2 |
| 2008/0299799 A1 | 12/2008 | Yoshida et al. | | |
| 2008/0299800 A1 * | 12/2008 | Yoshida | ............. | H01R 13/5227 439/76.2 |
| 2009/0130882 A1 * | 5/2009 | Yamaguchi | ........... | H05K 7/026 439/271 |
| 2009/0163053 A1 * | 6/2009 | Yamaguchi | .......... | H01R 9/2466 439/76.1 |
| 2009/0298310 A1 * | 12/2009 | Nakanishi | ............. | H02G 3/088 439/76.2 |
| 2009/0298311 A1 * | 12/2009 | Nakanishi | ............. | H02G 3/088 439/76.2 |
| 2014/0231129 A1 * | 8/2014 | Kakimi | .................. | H02G 3/088 174/535 |
| 2015/0250070 A1 * | 9/2015 | Anami | ................ | H05K 5/0239 361/752 |

FOREIGN PATENT DOCUMENTS

| | | |
|---|---|---|
| JP | 2008295263 A | 12/2008 |
| JP | 2009303463 A | 12/2009 |

* cited by examiner

ELECTRICAL CONNECTION BOX

CROSS-REFERENCE TO RELATED APPLICATIONS

This application is a U.S. National Stage patent application filing under 35 USC §371 of international Patent Cooperation Treaty (PCT) Application No. PCT/JP2014/001403, filed on Mar. 12, 2014, and entitled "ELECTRICAL CONNECTION BOX," which claims priority to Japanese Patent Application No. 2013-094684, filed on Apr. 26, 2013, both of which applications are hereby incorporated by reference herein in their entireties.

TECHNICAL FIELD

The present invention relates to an electrical connection box that houses therein electronic components, terminals, and the like. In more detail, the present invention relates to a configuration in which the electronic components and the terminals are arranged such that the electrical connection box can be downsized.

BACKGROUND ART

Conventionally known is an electrical connection box in which electronic components such as a fuse and a relay mounted on a board are covered with a covering. The electrical connection box is installed in, for example, an engine room of an automobile. The electrical connection box includes a large number of terminals, and the terminals are connected to an electrical device, and the like, arranged in the engine room.

Here, water may enter the electrical connection box when the covering is damaged or during a maintenance operation. Entry of water into the electrical connection box and exposure of an electronic component to the water may cause short-circuit of the electronic component. It is therefore preferable that the water is quickly drained. Patent Documents 1 and 2 disclose electrical connection boxes including drain mechanisms.

The electrical connection box of the Patent Document 1 includes a housing configured to house terminals. The housing is provided with a wall for preventing an electronic component arranged in the electrical connection box to be exposed to water having entered the electrical connection box. The housing is also provided with a drain channel through which water having entered the electrical connection box is discharged to the outside.

An electrical connection box of the Patent Document 2 includes a block that holds terminals. A drain channel (groove) through which water having entered the electrical connection box is discharged to the outside is provided below the block.

PRIOR-ART DOCUMENTS

Patent Documents

Patent Document 1: Japanese Patent Application Laid-Open No. 2002-152943
Patent Document 2: Japanese Patent Application Laid-Open No. 2008-295263

SUMMARY OF THE INVENTION

Problems to be Solved by the Invention

In each of the Patent Documents 1 and 2, the drain channel is formed on an along a surface of a board. Therefore, no electronic component can be arranged in a region where the drain channel is formed, which hinders downsizing of the electrical connection box.

In each of the Patent Documents 1 and 2, the terminal extends substantially perpendicularly from the board and then is bent substantially at a right angle. Thus, a distal end portion of the terminal (a portion to be engaged with a connector) extends in parallel with the board. Thus, in consideration of the workability at a time of engagement of the terminal to the connector, it is preferable that the terminal is positioned in an end portion of the board. In the Patent Documents 1 and 2, there is a limitation to the position of the terminal, which prevents efficient arrangement of electronic components and terminals on the board. In this point as well, downsizing of the electrical connection box is difficult.

The demand that electronic components and terminals be efficiently arranged on a board of an electrical connection box such that downsizing of the electrical connection box is allowed is also applied to an electrical connection box including no drain structure.

The present invention has been made in view of the circumstances described above, and a primary object of the present invention is to provide an electrical connection box that achieves downsizing by means of efficient arrangement of electronic components and terminals on a board.

Means for Solving the Problems and Effects Thereof

Problems to be solved by the present invention are as described above, and next, means for solving the problems and effects thereof will be described.

In an aspect of the present invention, an electrical connection box having the following configuration is provided. The electrical connection box includes a board, a terminal holder, a terminal, and an electronic component. The terminal holder is mounted to the board. The terminal is mounted to the terminal holder. The electronic component is mounted to the board. The terminal includes a first portion, a second portion, and a third portion. The first portion is connected to the board, and extends substantially perpendicularly from the board. The second portion is connected to the first portion, and extends substantially in parallel with the board. The third portion is connected to the second portion, is connectable to a connector, and extends substantially perpendicularly to the board. The electronic component is arranged between the second portion of the terminal and the board.

Accordingly, the electronic component can be arranged in a space defined by the terminal bent into a cranked shape. This allows effective use of the space existing on the board so that the terminal and the electronic component are arranged efficiently. Thus, the electrical connection box having a small size can be manufactured.

Preferably, the electrical connection box is configured as follows. The electrical connection box includes a plurality of the terminals. At least two of the terminals are arranged opposed to each other such that their first portions are opposed to each other and their third portions are opposed to each other and such that the interval between their first portions is wider than the interval between their third portions.

Accordingly, a space enclosed by the board and the terminal can be large. This allows even the electronic component having a large size to be arranged between the terminals, with manufacturing of the electrical connection box having a small size.

In the electrical connection box, it is preferable that a lower drain channel for draining water having entered the interior of the terminal holder is provided in the terminal holder, the lower drain channel being provided below the second portion of the terminal.

Accordingly, the drain channel can be provided at a relatively lower level, which prevents water from being pooled in the terminal holder.

In the electrical connection box, it is preferable that an upper drain channel for draining water having entered the interior of the terminal holder is provided in the terminal holder, the upper drain channel being provided between the third portions of the opposed terminals.

Accordingly, the drain channel can be provided near a portion (a connector hole formed in a covering of the electrical connection box) engaged with the connector. This enables water having entered the interior of the electrical connection box to be drained in an early stage.

Preferably, the electrical connection box is configured as follows. The position of an end portion of the terminal holder and the position of an end portion of the board are aligned with each other. The terminal holder includes a draining part that drains, to the outside, water having flowed through a drain channel, the draining part extending substantially perpendicularly from an end portion of the board.

This allows more effective use of a space existing on the board, as compared with a configuration in which the draining part is arranged obliquely. Accordingly, a more space-saving electrical connection box is achieved.

EMBODIMENT FOR CARRYING OUT THE INVENTION

Figure 1:
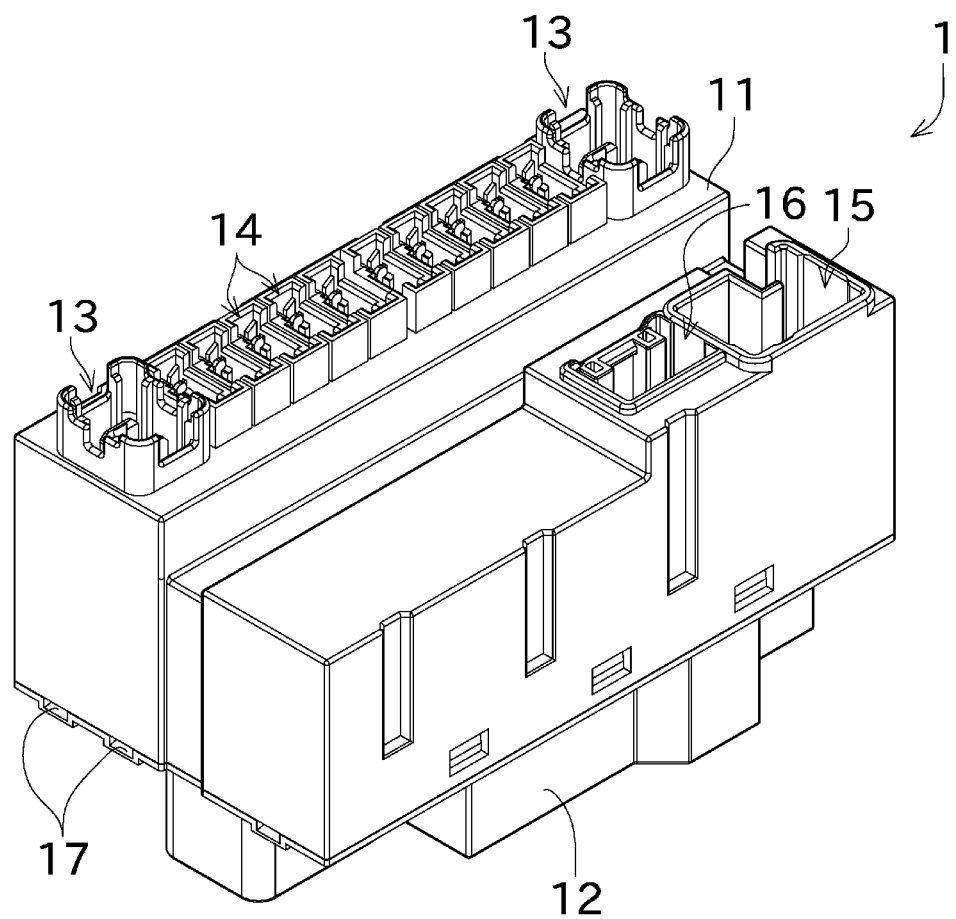
FIG. 1 A perspective view showing an external appearance of an electrical connection box according to an embodiment of the present invention.

Next, an embodiment of the present invention will be described with reference to the drawings. FIG. 1 is a perspective view showing an external appearance of an electrical connection box 1 according to an embodiment of the present invention.

The electrical connection box 1 is configured as a junction box for use in an automobile. As shown in FIG. 1, the electrical connection box 1 is externally covered with an upper covering 11 and a lower covering 12.

The upper covering 11 has connector holes 13 to 16. Connectors are received in the connector holes 13 to 16. Through the connectors, the electrical connection box 1 is connected to electrical devices of the automobile. The lower covering 12 also has connector holes, though not shown.

Drain ports 17 are provided between the upper covering 11 and the lower covering 12. The drain ports 17 discharge, to the outside, water having entered the electrical connection box 1 through a damaged portion of the upper covering 11 or the connector holes 13 to 16. A configuration for discharging water having entered the electrical connection box 1 will be described later.

Figure 2:
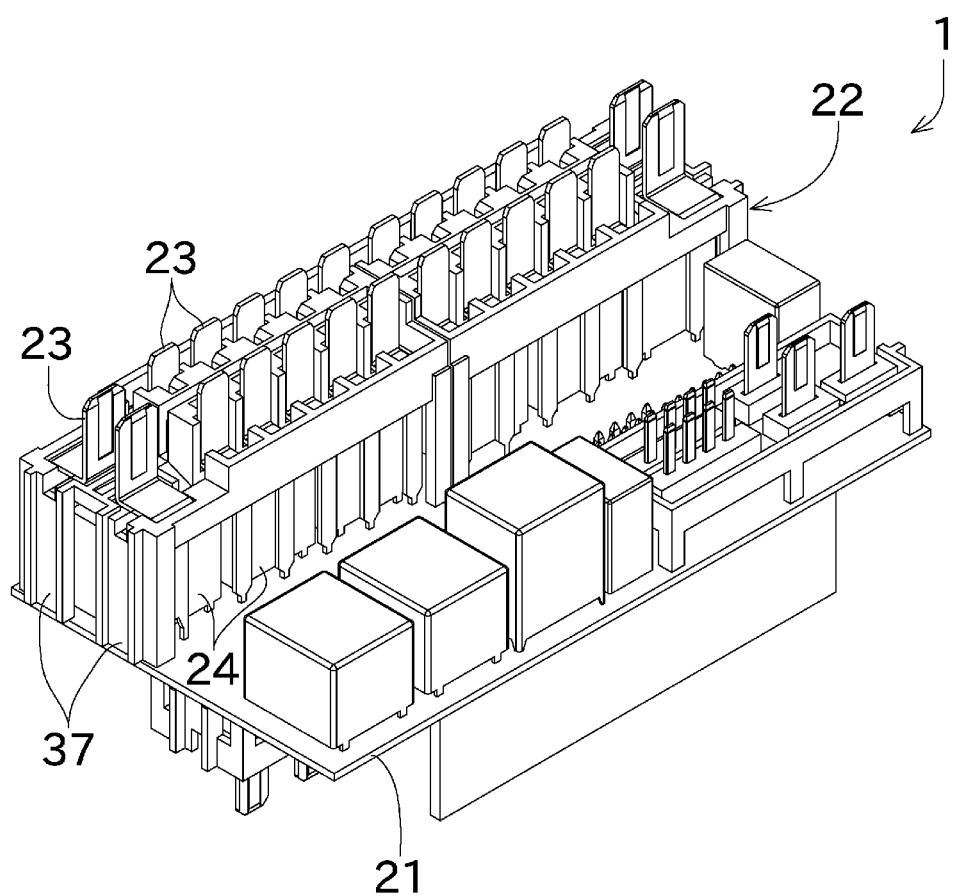
FIG. 2 A perspective view showing a configuration of the electrical connection box from which an upper covering and a lower covering are removed.

FIG. 2 shows a state where the upper covering 11 and the lower covering 12 are removed. As shown in FIG. 2, a board 21 is arranged within the electrical connection box 1. Many components, namely, electronic components such as a fuse and a relay, terminals to be engaged with external connectors, and a terminal holder for holding the terminals, are arranged on the board 21.

To downsize the electrical connection box 1, efficient arrangement of these components is needed. In this embodiment, a terminal holder 22, flat-plate terminals (terminals) 23, and electronic components 24, which are shown in FIG. 2, are arranged more efficiently as compared with a conventional configuration.

In the following, the shape of the terminal holder 22, the shape of the flat-plate terminal 23, and the positional relationship among the components, will be described.

Figure 3:
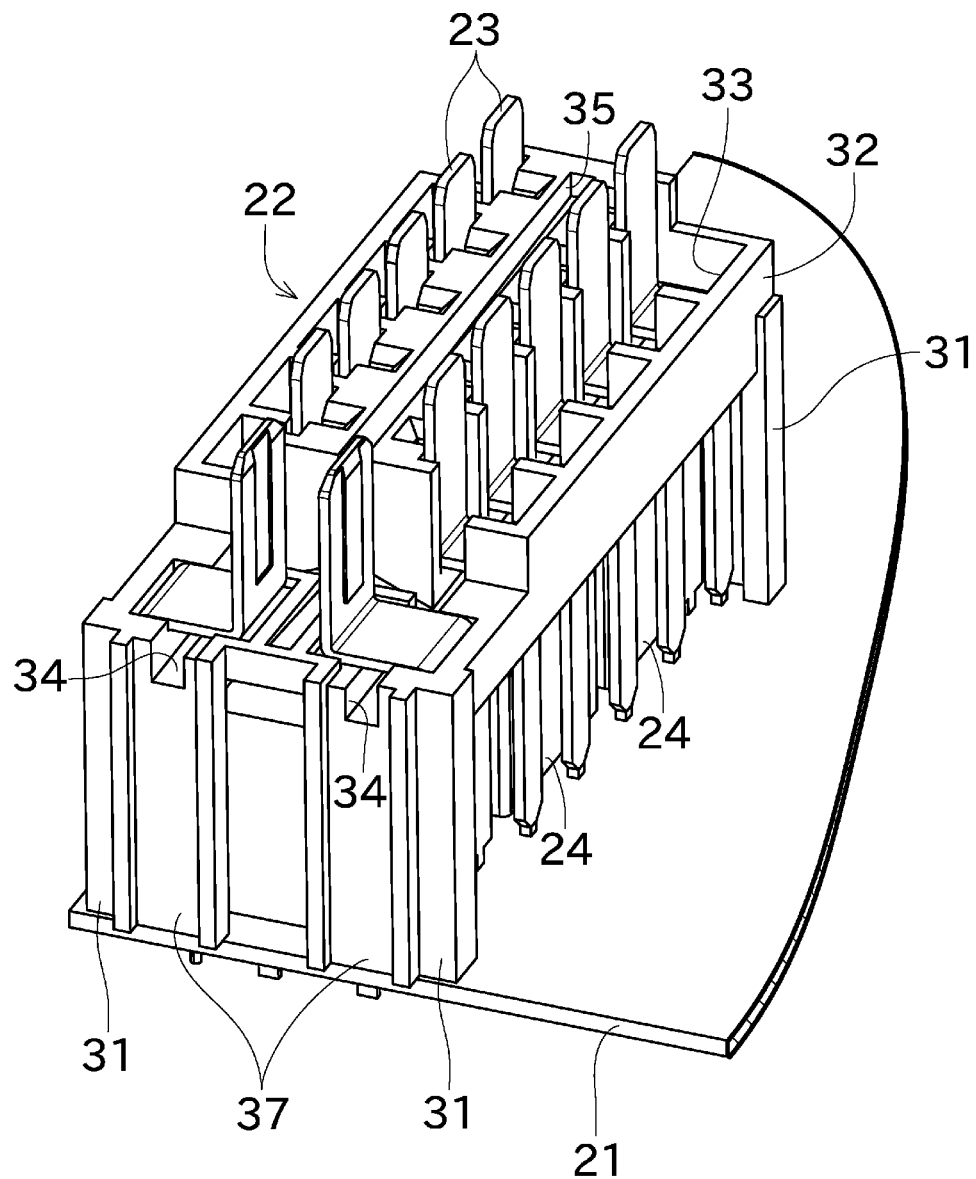
FIG. 3 A perspective view showing a configuration of a terminal holder and terminals on an enlarged scale.

FIG. 3 shows, on an enlarged scale, the terminal holder 22, the flat-plate terminals 23, and the electronic components 24. A portion shown in FIG. 3 is a unit including the terminal holder 22, the flat-plate terminals 23, and the electronic components 24. The number of the units included in the electrical connection box 1 is two, as shown in FIG. 2. Since the two units are configured in the same manner, the unit shown in FIG. 3 will be described as a representative.

Figure 4:
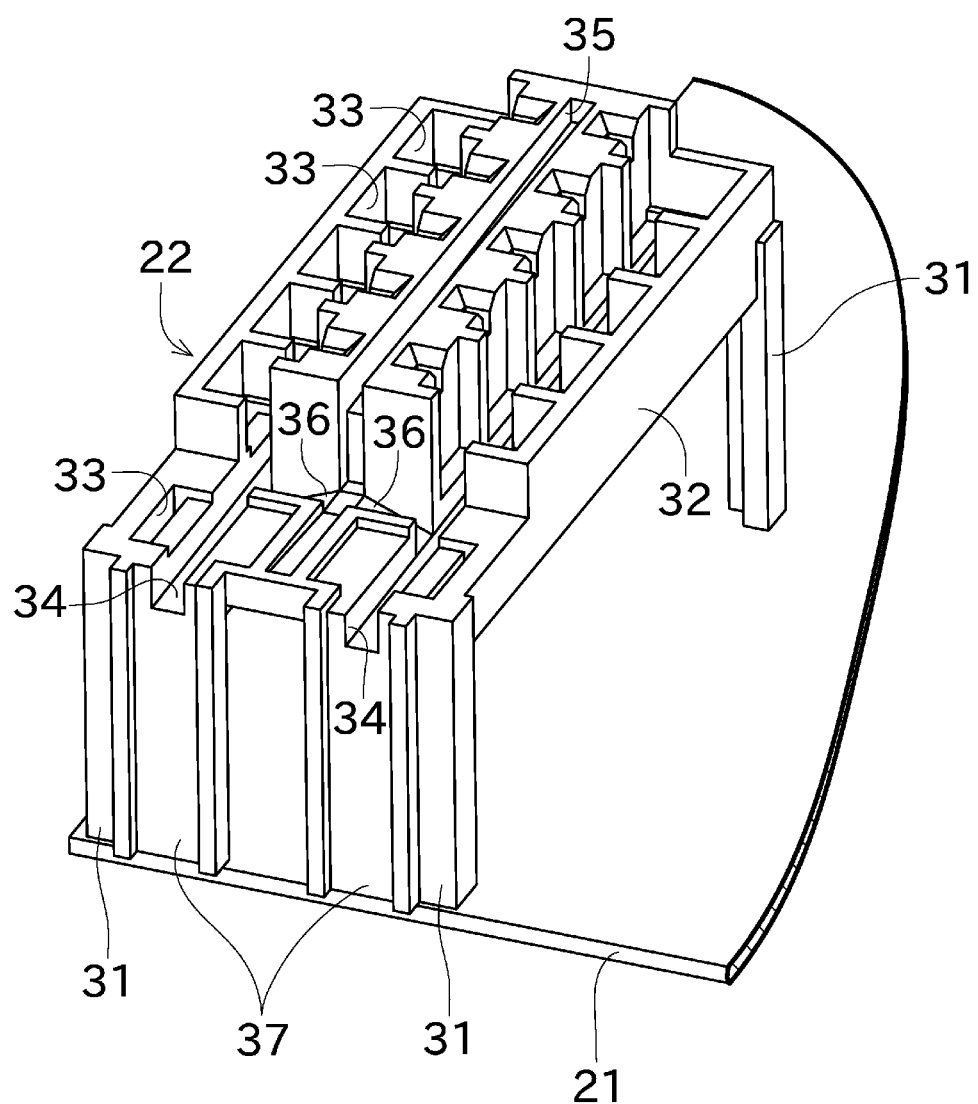
FIG. 4 A perspective view showing a configuration of the terminal holder on an enlarged scale.
Figure 5:
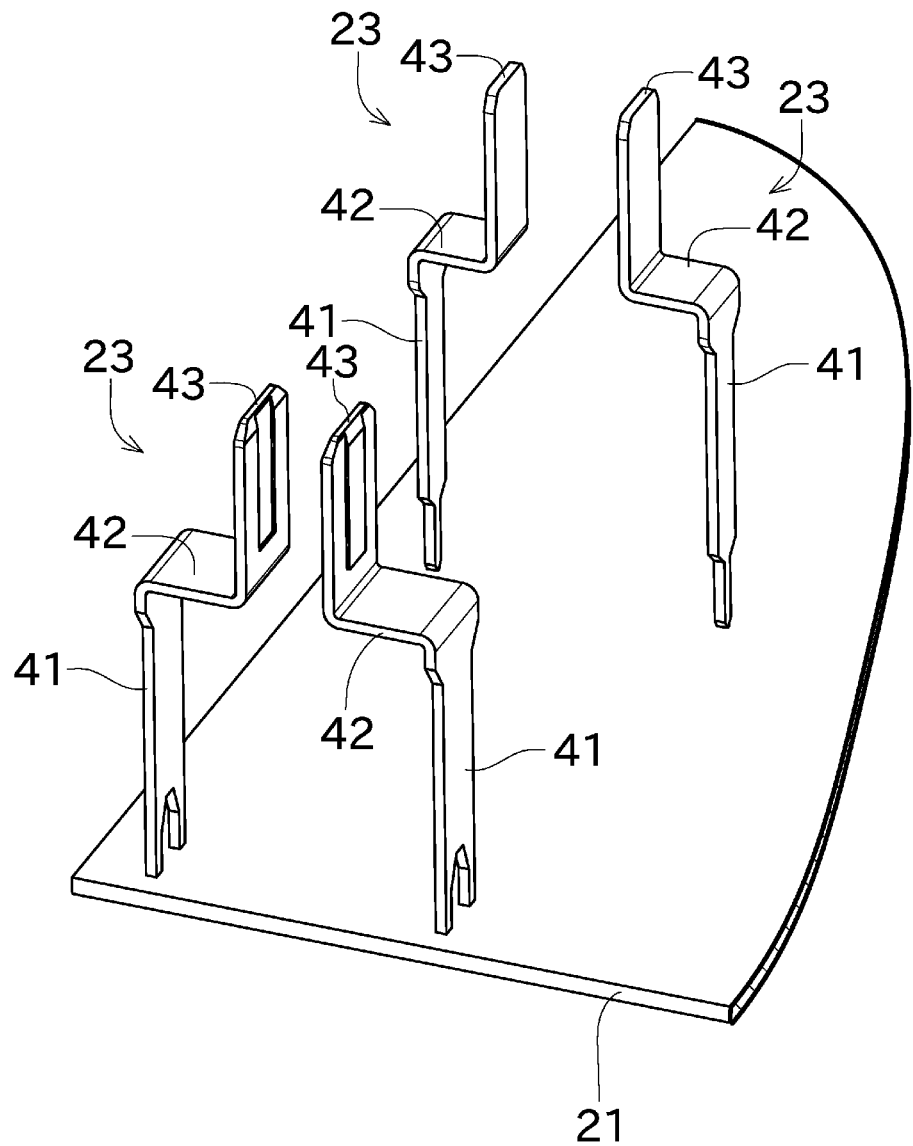
FIG. 5 A perspective view showing a configuration of the terminal on an enlarged scale.

FIG. 4 is a perspective view showing only the terminal holder 22 and the board 21 among the components shown in FIG. 3. FIG. 5 is a perspective view showing only the board 21 and part of the flat-plate terminals 23 among the components shown in FIG. 3.

As shown in FIGS. 3 and 4, the terminal holder 22 includes support columns 31 and a terminal table 32. Terminal mounts 33, lower drain channels 34, an upper drain channel 35, inclinations 36, and draining parts 37 are provided in the terminal table 32. The terminal holder 22 and the board 21 are arranged such that, when seen in the thickness direction of the board 21, an end portion (part of the outer edge) of the terminal holder 22 and an end portion (part of the outer edge) of the board 21 are aligned (substantially coincident) with each other.

The support column 31 is a column-shaped member extending perpendicularly from the board 21. The terminal holder 22 is configured such that the terminal table 32 is supported on four support columns 31.

The terminal table 32 is a member supported on the support columns 31. The terminal mounts 33 in which terminals are mounted, the lower drain channels 34 and the upper drain channel 35 configured to drain water having entered the interior of the electrical connection box 1, and the like, are provided in the terminal table 32.

A plurality of the terminal mounts 33 are arranged side by side in the width direction of the flat-plate terminal 23. The terminal mounts 33 are provided in pairs such that each pair of terminal mounts 33 are opposed to each other across the upper drain channel 35.

The lower drain channels 34 are grooves arranged near the terminal mounts 33.

The lower drain channel 34, which extends at the lower side (at the board 21 side) of a second portion (which will be described later) of each flat-plate terminal 23, is configured to allow water to flow in the direction from the upper right toward the lower left in FIG. 4. The lower drain channels 34 are provided in a pair such that they are opposed to each other across the upper drain channel 35.

The upper drain channel 35 is a groove provided at the center of the terminal holder 22 and extending between the terminal mounts 33 that are arranged opposed to each other. Similarly to the lower drain channel 34, the upper drain channel 35 is configured to allow water to flow in the direction from the upper right toward the lower left in FIG. 4. The upper drain channel 35 is provided at the upper side (at the upper covering 11 side) of the lower drain channels 34.

The inclinations 36, which are connected to the upper drain channel 35, are portions where water having flowed through the upper drain channel 35 meets the lower drain channels 34.

The draining parts 37 are provided in the end portion of the terminal holder 22, and positioned adjacent to the support columns 31. The draining parts 37 connect the terminal table 32 to the end portion of the board 21. The draining parts 37 are connected to the lower drain channels 34, and configured to discharge water having flowed through the lower drain channels 34. Water discharged from the draining parts 37 is discharged to the outside through the drain ports 17 provided in the upper covering 11.

Next, the flat-plate terminal 23 will be described. As shown in FIG. 5, the flat-plate terminal 23 is formed of a flat-plate-shaped member made of a metal. The flat-plate terminal 23 includes a first portion 41, a second portion 42, and a third portion 43 that are formed as a result of the flat-plate-shaped member being bent. FIG. 5 illustrates only part of the flat-plate terminals 23, for easy recognition of the shape of the flat-plate terminal 23.

The first portion 41 has its one end connected to the board 21. The first portion 41 extends substantially perpendicularly from the board 21. The first portion 41 has its other end connected to the second portion 42.

The second portion 42 is arranged so as to extend substantially in parallel with the board 21 (extend substantially perpendicularly to the first portion 41). The second portion 42 has its one end connected to the first portion 41, and its other end connected to the third portion 43.

The third portion 43 is arranged so as to extend substantially perpendicularly to the board 21 (extend substantially in parallel with the first portion 41). The third portion 43 has its one end connected to the second portion 42, and its other end being engageable with an external connector. The third portion 43 is configured to, starting from where the third portion 43 is connected to the second portion 42, extend in the direction away from the board 21.

The flat-plate terminals 23 are arranged side by side in the width direction of the terminal, and also arranged such that their first portions 41 are opposed to each other and their third portions 43 are opposed to each other. Consideration has been made of the direction of arrangement of the flat-plate terminals 23 such that the interval between the first portions 41 is wider than the interval between the third portions 43.

The electronic component 24, which is a relay, a fuse, or the like, is connected to the board 21.

Figure 6:
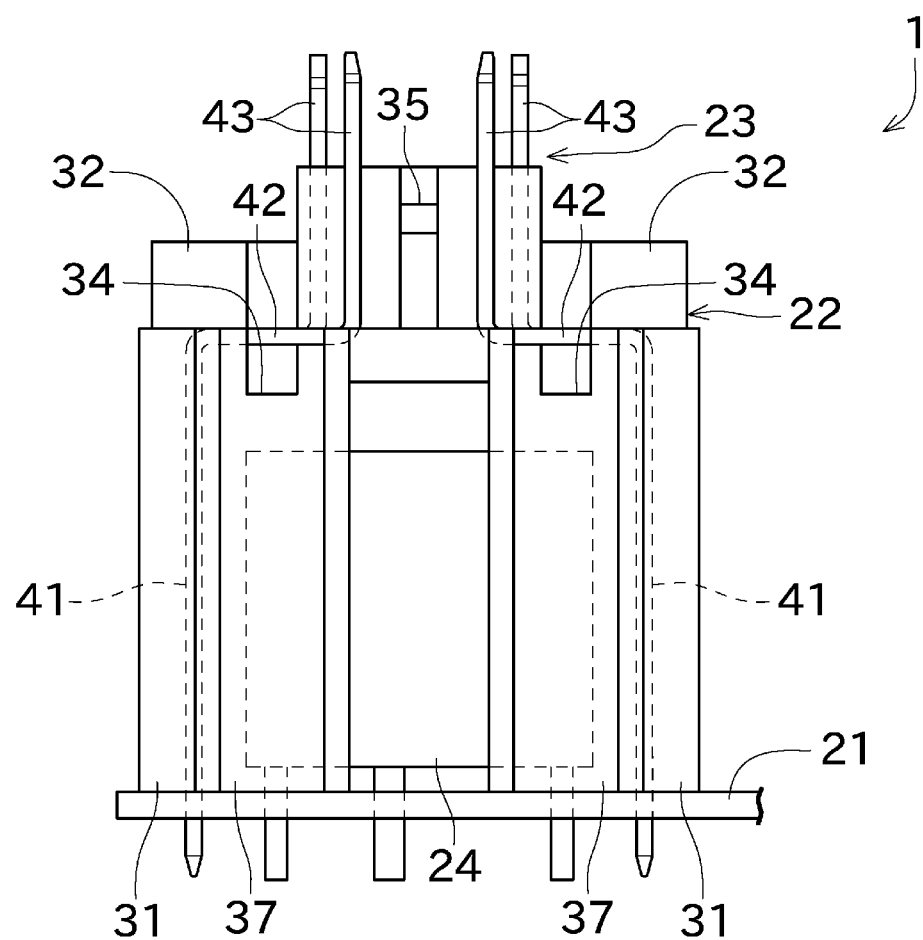
FIG. 6 A side view showing the positional relationship among the terminal holder, the terminals, and an electronic component.

Next, the positional relationship among the terminal holder 22, the flat-plate terminals 23, and the electronic component 24 will be described. FIG. 6 is a side view showing the positional relationship among the terminal holder 22, the flat-plate terminals 23, and the electronic component 24.

As shown in FIG. 6, the electronic component 24 is arranged in a region enclosed by the board 21, the first portions 41 of the opposed flat-plate terminals 23, and the second portions 42 of the opposed flat-plate terminals 23. This enables the flat-plate terminals 23 and the electronic component 24 to be efficiently arranged in a space existing on the board 21. As a result, the electrical connection box 1 can be downsized.

Apparently, the same effect would be obtained from a configuration in which straight-shaped terminals having no curved portion are arranged side by side and an electronic component is arranged between the terminals. In such a configuration, however, setting the interval between the terminals in accordance with the size of the electronic component results in a wide interval between distal end portions of the terminals. This makes engagement with an external connector difficult. On the other hand, narrowing the interval between the terminals results in a limitation to the type of the electronic component allowed to be arranged between the terminals. This reduces the degree of freedom in the layout.

In this respect, this embodiment is able to set the interval between the first portions 41 in accordance with the size of the electronic component 24, set the interval between the third portions 43 in accordance with, for example, the shape of an external connector, and adjust the difference between the intervals by means of the second portion 42. Accordingly, the flat-plate terminals 23 and the electronic component 24 can be efficiently arranged in a space existing on the board 21 irrespective of the size of the electronic component 24, and the like.

Moreover, this embodiment in which the flat-plate terminals 23 are arranged side by side enables efficient use of the space existing on the board 21 even when an electronic component 24 elongated in the direction of the side-by-side arrangement of the flat-plate terminals 23 or even when electronic components 24 are arranged side by side in the direction of side-by-side arrangement of the flat-plate terminals 23.

The terminal mount 33 of the terminal holder 22 supports the flat-plate terminal 23 by supporting the second portion 42. The lower drain channel 34 is a groove provided below where the second portion 42 is supported. Thus, the lower drain channel 34 can be provided at a relatively lower level, which allows water having entered the electrical connection box 1 to be discharged without being pooled.

If the terminal has a straight shape or has only one bent portion, the terminal is often supported in a sandwiched manner. In this embodiment, the flat-plate terminal 23 is cranked so that supporting the second portion 42 enables stable support. This can lead to a conclusion that forming a terminal into a cranked shape and providing the lower drain channel 34 in an area where the second portion 42 is supported are highly compatible.

Since the electronic component 24 is arranged below the second portion 42, the position where the lower drain channel 34 is provided can be sufficiently low to prevent the electronic component 24 from being exposed to water.

The upper drain channel 35 is provided between the third portions 43 of the flat-plate terminals 23 (in other words, above the second portions 42 or at the side opposite to the board 21). As a result, the drain channel can be provided near portions (connector holes 13 to 16) engaged with an external connector. This enables water having entered the interior of the electrical connection box 1 to be drained in an early stage.

In this embodiment, the draining part 37 is formed so as to extend perpendicularly from the board 21. This allows more effective use of the space existing on the board, as compared with a configuration in which the draining part 37 is formed obliquely or formed so as to extend on and along the board 21. Accordingly, downsizing of the electrical connection box 1 is achieved.

As thus far described above, the electrical connection box 1 of this embodiment includes the board 21, the terminal holder 22, the flat-plate terminal 23, and the electronic component 24. The terminal holder 22 is mounted to the board 21. The flat-plate terminal 23 is mounted to the terminal holder 22. The electronic component 24 is mounted to the board 21. The flat-plate terminal 23 includes the first portion 41, the second portion 42, and the third portion 43. The first portion 41 is connected to the board 21, and extends substantially perpendicularly from the board 21. The second portion 42 is connected to the first portion 41, and extends substantially in parallel with the board 21. The third portion 43 is connected to the second portion 42, is connectable to a connector, and extends substantially perpendicularly to the board 21. The electronic component 24 is arranged between the second portion 42 of the flat-plate terminal 23 and the board 21.

Accordingly, the electronic component 24 can be arranged in a space defined by the flat-plate terminal 23 bent into a cranked shape. This allows effective use of the space existing on the board so that the flat-plate terminal 23 and the electronic component 24 are arranged efficiently. Thus, the electrical connection box 1 having a small size can be manufactured.

The electrical connection box 1 of this embodiment includes a plurality of the flat-plate terminals 23. At least two of the flat-plate terminals 23 are arranged such that their first portions 41 are opposed to each other and their third portions 43 are opposed to each other and such that the interval between their first portions 41 is wider than the interval between their third portions 43.

Accordingly, a space enclosed by the board 21 and the flat-plate terminals 23 can be large. This allows even the electronic component 24 having a large size to be arranged between the flat-plate terminals 23, with manufacturing of the electrical connection box 1 having a small size.

Figure 7:
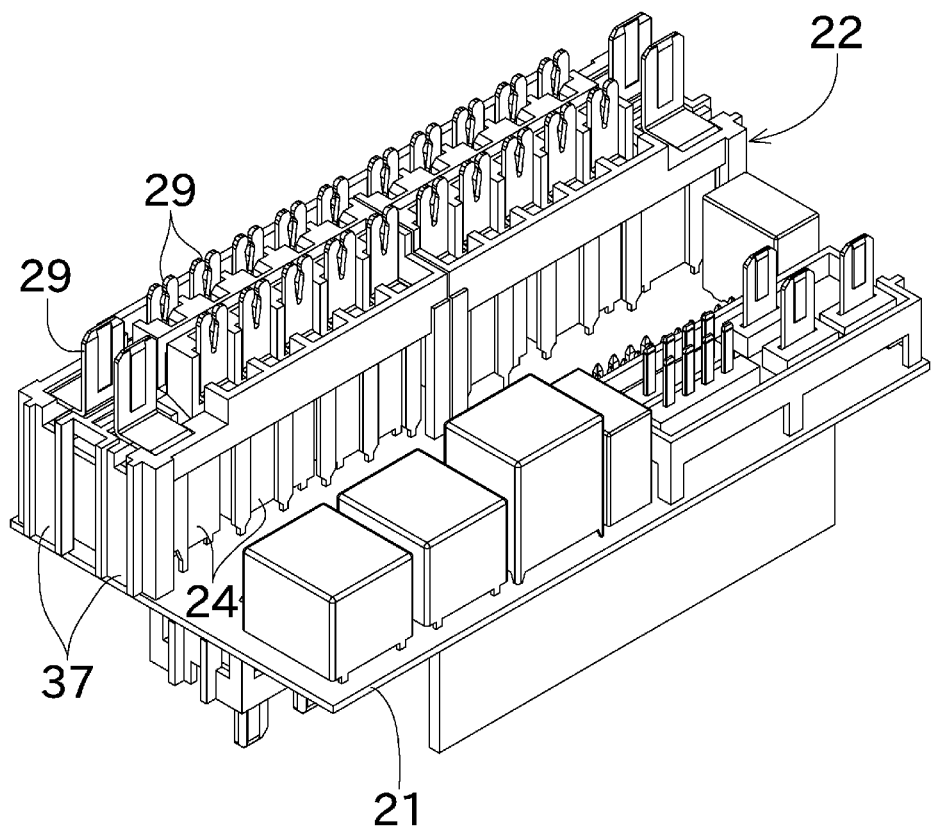
FIG. 7 A perspective view showing a configuration inside a covering of an electrical connection box according to a modification.

Next, a modification of the above-described embodiment will be described. FIG. 7 is a perspective view showing a configuration inside a covering of the electrical connection box 1 according to a modification. In the description of this modification, members identical or similar to those of the above-described embodiment may not be described and instead the same reference signs as in the above-described embodiment are given on the drawings.

In the above-described embodiment, the terminal held on the terminal holder 22 is the flat-plate terminal 23 having a flat-plate shape. In this modification, it is a tuning-fork-like terminal 29 having a notch (coupling portion) at the center thereof.

The terminal may have any shape. It may be a rod-like shape or more complicated shapes. Only the distal end (third portion 43) may have a shape different from the shapes of the other portions.

Although a preferred embodiment of the present invention and a modification thereof have been described above, the above-described configurations can be modified, for example, as follows.

The terminal holder 22 may have any shape. How to mount the flat-plate terminal 23, the type of the flat-plate terminal 23 allowed to be mounted, the number of the flat-plate terminal 23 allowed to be mounted, and the like, can be changed as appropriate. It is preferable that the terminal holder 22 is installed in an end portion of the board 21 in order to make the draining part 37 extend substantially perpendicularly. However, it may be acceptable that the terminal holder 22 is arranged in another position.

In a case where no drain structure is required, the drain structure (the lower drain channels 34, the upper drain channel 35, the inclinations 36, and the draining parts 37) needs not be provided to the terminal holder 22. In this case as well, the effect is exerted that components can be efficiently arranged so that downsizing of the electrical connection box 1 is achieved.

Although the above-described embodiment and the modification illustrate the configuration in which only part of the flat-plate terminals 23 arranged on the board 21 are cranked, it is acceptable that the terminals arranged in other positions are also cranked so that components are efficiently arranged.

Although the above-described embodiment and the modification illustrate the configuration in which the flat-plate terminals 23 are arranged opposed to each other, it is acceptable that the flat-plate terminals 23 are not opposed to each other. In such a case, arranging the flat-plate terminals 23 along the edge of the board 21 achieves efficient arrangement of components.

The configuration of the present application is applicable to a fuse box, a junction block, a relay box, and the like. Applications of the configuration are not limited to an electrical connection box for use in an automobile.

DESCRIPTION OF THE REFERENCE NUMERALS 1 electrical connection box
11 upper covering
12 lower covering
21 board
22 terminal holder
23 flat-plate terminal (terminal)
24 electronic component
29 tuning-fork-like terminal (terminal)
31 support column
32 terminal table
33 terminal mount
34 lower drain channel
35 upper drain channel
36 inclination
37 draining part
41 first portion
42 second portion
43 third portion

The invention claimed is:
1. An electrical connection box, comprising: a board; a terminal holder mounted to the board; a plurality of the terminals comprising a terminal mounted to the terminal holder; and an electronic component mounted to the board, the terminal including: a first portion that is connected to the board and extends substantially perpendicularly from the board; a second portion that is connected to the first portion and extends substantially in parallel with the board; and a third portion that is connected to the second portion, is connectable with a connector, and extends substantially perpendicularly to the board, the electronic component being arranged between the second portion of the terminal and the boards, wherein at least two terminals of the plurality of terminals are arranged opposed to each other such that their first portions are opposed to each other and their third portions are opposed to each other and such that an interval between their first portions is wider than an interval between their third portions, a lower drain channel for draining water having entered an interior of the terminal holder is provided in the terminal holder, the lower drain channel being provided below the second portion of the terminal, a position of an end portion of the terminal holder and a position of an end portion of the board are aligned with each other, and the terminal holder includes a draining part that drains, to outside, water having flowed through the lower drain channel, the draining part extending substantially perpendicularly from the end portion of the board.

2. The electrical connection box according to claim 1, wherein an upper drain channel for draining water having entered the interior of the terminal holder is provided in the terminal holder, the upper drain channel being provided between the third portions of the at least two terminals.

* * * * *